United States Patent
Tang et al.

(10) Patent No.: US 11,990,395 B2
(45) Date of Patent: May 21, 2024

(54) JOINT CONNECTION OF CORNER NON-CRITICAL TO FUNCTION (NCTF) BALL FOR BGA SOLDER JOINT RELIABILITY (SJR) ENHANCEMENT

(71) Applicant: Intel Corporation, Santa Clara, CA (US)

(72) Inventors: Xiaoying Tang, Shanghai (CN); Zhicheng Ding, Shanghai (CN); Bin Liu, Shanghai (CN); Yong She, Shanghai (CN); Zhijun Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 17/425,227

(22) PCT Filed: Feb. 22, 2019

(86) PCT No.: PCT/CN2019/075875
§ 371 (c)(1),
(2) Date: Jul. 22, 2021

(87) PCT Pub. No.: WO2020/168552
PCT Pub. Date: Aug. 27, 2020

(65) Prior Publication Data
US 2022/0122907 A1    Apr. 21, 2022

(51) Int. Cl.
*H01L 23/498* (2006.01)
*H01L 23/00* (2006.01)

(52) U.S. Cl.
CPC ...... *H01L 23/49816* (2013.01); *H01L 24/11* (2013.01); *H01L 24/13* (2013.01);
(Continued)

(58) Field of Classification Search
CPC ................................. H01L 23/49816
See application file for complete search history.

(56) References Cited

U.S. PATENT DOCUMENTS 5,490,040 A * 2/1996 Gaudenzi .......... H01L 23/49811
361/779
5,796,169 A * 8/1998 Dockerty .......... H01L 23/49838
257/E21.511
(Continued)

FOREIGN PATENT DOCUMENTS

CN          1100473 C       1/2003

OTHER PUBLICATIONS

International Search Report and Written Opinion for International Patent Application No. PCT/CN2019/075875 dated Nov. 8, 2019, 9 pgs.

*Primary Examiner* — William A Harriston
(74) *Attorney, Agent, or Firm* — Schwabe, Williamson & Wyatt, P.C.

(57) ABSTRACT

Embodiments include semiconductor packages and a method of forming the semiconductor packages. A semiconductor package includes a package substrate with a top surface, a corner portion, and a plurality of solder balls on the top surface of the package substrate. The semiconductor package also includes a pattern on the corner portion of the package substrate. The pattern may have a width substantially equal to a width of the solder balls. The pattern may also include a continuous line having solder materials. The semiconductor package may include a plurality of conductive pads on the package substrate. The conductive pads may be coupled to the pattern. The pattern may have a z-height that is substantially equal to a z-height of the solder balls, and have one or more outer edges, where the outer edges of
(Continued)

the pattern are sidewalls. The sidewalls of the pattern may be substantially vertical or tapered sidewalls.

25 Claims, 4 Drawing Sheets

(52) U.S. Cl.
CPC .............. *H01L 24/14* (2013.01); *H01L 24/16* (2013.01); *H01L 24/81* (2013.01); *H01L 2224/1319* (2013.01); *H01L 2224/14179* (2013.01); *H01L 2224/16227* (2013.01); *H01L 2224/27849* (2013.01); *H01L 2224/81815* (2013.01); *H01L 2924/15311* (2013.01)

(56) References Cited

U.S. PATENT DOCUMENTS

| | | | |
|---|---|---|---|
| 6,927,491 B1 * | 8/2005 | Yamada | H01L 24/14 257/E21.511 |
| 6,930,400 B1 * | 8/2005 | Bishop | H05K 1/111 257/737 |
| 2004/0251544 A1 | 12/2004 | Hussa | |

* cited by examiner

JOINT CONNECTION OF CORNER NON-CRITICAL TO FUNCTION (NCTF) BALL FOR BGA SOLDER JOINT RELIABILITY (SJR) ENHANCEMENT

CROSS-REFERENCE TO RELATED APPLICATION

This patent application is a U.S. National Phase Application under 35 U.S.C. § 371 of International Application No. PCT/CN2019/075875, filed Feb. 22, 2019, entitled "JOINT CONNECTION OF CORNER NON-CRITICAL TO FUNCTION (NCTF) BALL FOR BGA SOLDER JOINT RELIABILITY (SJR) ENHANCEMENT," which designates the United States of America, the entire disclosure of which is hereby incorporated by reference in its entirety and for all purposes.

FIELD

Embodiments relate to packaging semiconductor devices. More particularly, the embodiments relate to semiconductor devices having joint connection of corner non-critical to function (NCTF) solder balls to enhance BGA solder joint reliability (SJR).

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. This also includes implementing various electrical components into a single semiconductor package, such as a ball grid array (BGA) device. The necessity to optimize the reliability of solder ball interconnects of each BGA device/package becomes increasingly significant.

Currently in the semiconductor industry, the solder balls of BGA packages typically have the same solder ball size throughout each BGA package. For example, the solder balls generally have the same size no matter whether the solder balls are located at the corner or center of such package. Additionally, a major problem of these BGA solder balls is that the corner solder balls are always located at the worst location of the package, which normally initiates solder joint cracks, voids, and shorting issues.

One existing solution of this problem includes having larger corner solder ball sizes on BGA package. This solution of larger corner solder ball sizes thus requires two or more different solder ball sizes, and at least two or more solder mounting tools, which subsequently necessitates a substantial increase in assembly time for the solder ball mount process. Accordingly, the tooling cost and assembly time for larger corner ball sizes increases as the standoff control worsens.

Another existing solution includes adding substantially more solder balls at the corner locations of the BGA package. This, however, forces the BGA package to fit additional corner solder balls which requires decreasing the solder ball pitch sizes and increasing the overall package size. Accordingly, this existing solution of increasing the number of corner solder balls subsequently increases the overall packaging cost significantly.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages having package substrates with joint connections of non-critical to function (NCTF) balls for ball grid arrays (BGAs) and method of forming such semiconductor packages. Embodiments of the semiconductor package described below and methods of forming such semiconductor package include a package substrate having a plurality of solder balls and a joint connection of solder balls (or a solder pattern), which enables joint connections of NCTF solder balls for BGAs and enhances the solder joint reliability (SJR) of the package substrate. As described herein, a "solder pattern" (or a first pattern) refers to an enhanced sacrificial solder joint pattern comprising of a plurality of first solder balls that were previously disposed on a package substrate, and a plurality of second solder balls that were subsequently disposed adjacent to the plurality of first solder balls, where a reflow (or a similar heating process) coupled/jointed the first and second solder balls to form the solder pattern.

In particular, the "solder pattern" refers to a pattern disposed on a corner portion of the package substrate, where the pattern may have a width that is substantially equal to a width of solder balls that surround (or are adjacent to) the pattern. The pattern may be a continuous line that includes one or more solder materials (e.g., the solder materials of the first solder balls coupled with the solder materials of the second solder materials). As described herein, a "continuous line" refers to a line having one end and another end that is opposite to the one end, where the line may be a solder line that is unbroken with no gaps. Note that, as described in further detail below, the solder pattern is not limited to solder and/or may include more than two pluralities of solder balls.

Accordingly, the solder patterns described herein improve packaging solutions by increasing the corner NCTF solder ball density with the same size ball pitch. These solder patterns also enable package substrates to overcome the stress concentration for the corner solder balls as such solder patterns form enhanced sacrificial ball matrixes that substantially improve the SJR performance of the respective semiconductor packages. Additional advantages of the solder patterns described herein include (i) only needing a one-time solder ball mount process which improves assembly cycle time; (ii) having solder balls with the same size ball pitch which reduces solder ball mount tooling and manufacture costs and simplifies material inventory control; and (iii) enabling a controlled co-planarity of the solder balls which simplifies and enhances the surface mount technology (SMT) process.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including BGA semiconductor package having package substrates with one or more pluralities of solder balls and solder patterns.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
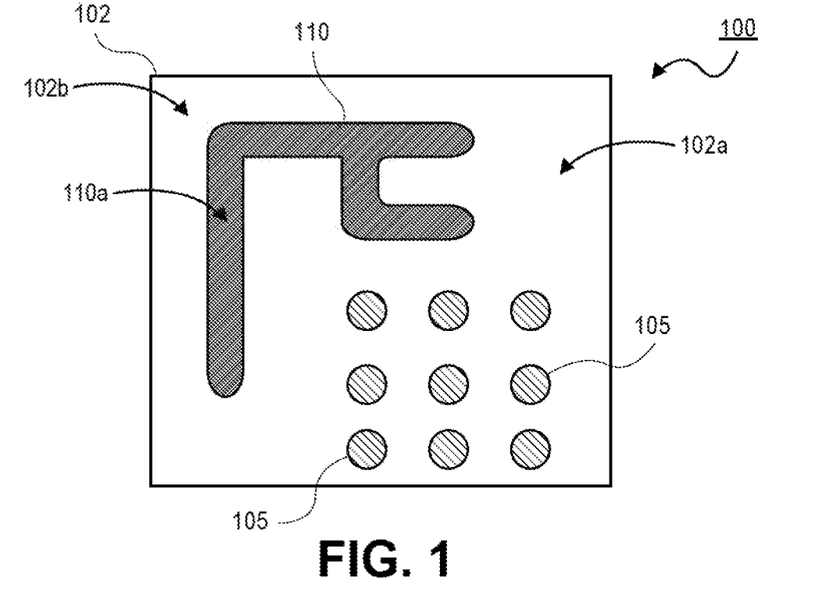
FIG. 1 is an illustration of a plan view of a ball grid array (BGA) semiconductor package having a package substrate with a plurality of solder balls and a solder pattern, according to one embodiment.

FIG. 1 is a plan view of a semiconductor package 100 having a package substrate 102 with a plurality of solder balls 105, according to one embodiment. In some embodiments, the semiconductor package 100 may be a BGA semiconductor package.

Figure 3:
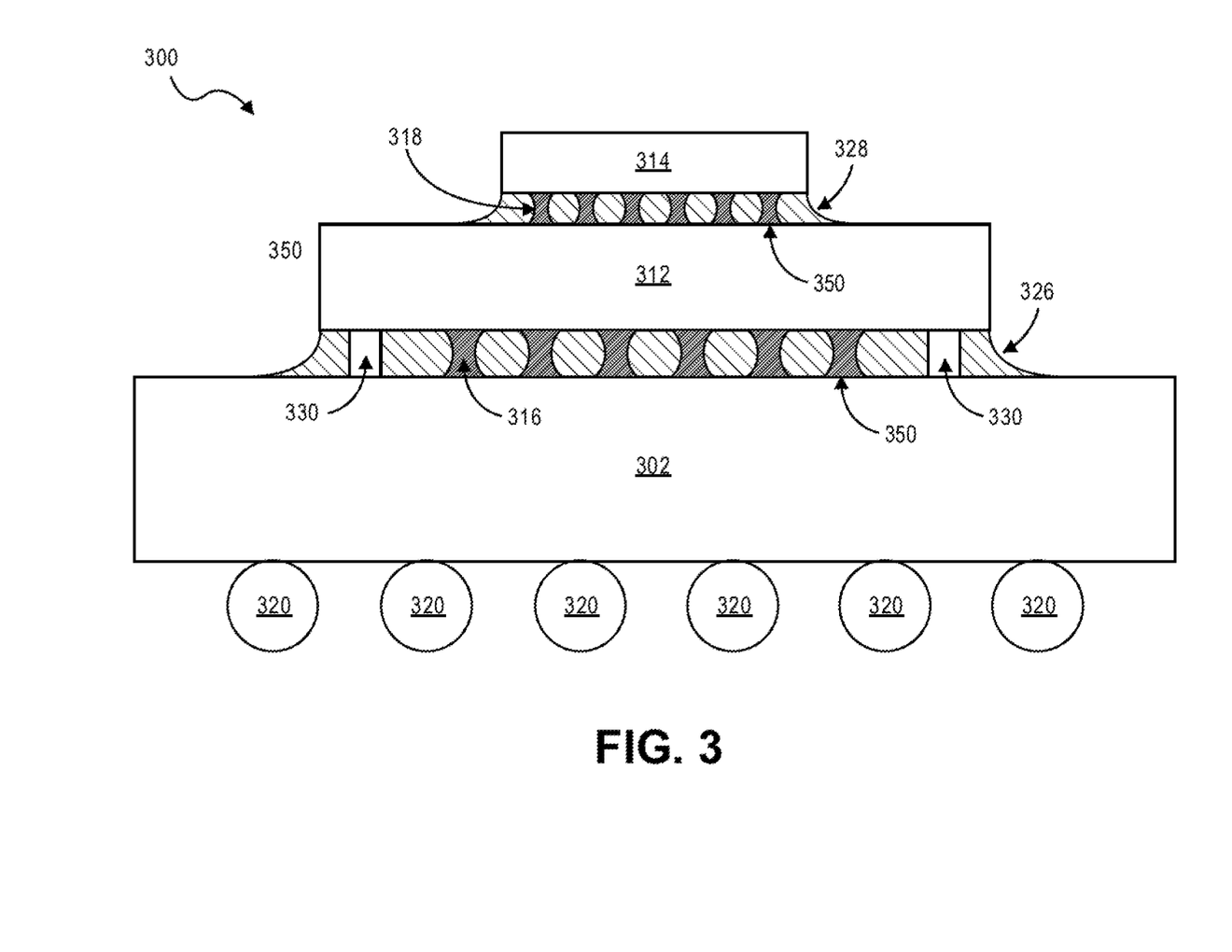
FIG. 3 is an illustration of a cross-sectional view of a semiconductor packaged system including a die, a substrate, a package substrate, and one or more semiconductor packages, according to one embodiment.

For some embodiments, the semiconductor package 100 includes a package substrate 102. The package substrate 102 may have a top surface 102a (or any other surface(s) on the package substrate 102) that includes one or more corner portions 102b (or corners, edges, portions on the corners/edges, etc.). The corner portion(s) 102b may be positioned/located on the outer periphery surface(s)/portion(s) of the top surface 102a of the package substrate 102. Note that the top surface 102a of the package substrate 102 may be positioned as the topmost surface of the package substrate 102 during some of the assembly steps of the semiconductor package 100, however the top surface 102a may be flipped and coupled onto another substrate such as a motherboard and/or a printed circuit board (PCB) (e.g., as shown in FIG. 3), where the top surface 102a may thus be positioned facing down (i.e., the top surface 102a may now be positioned as the bottommost surface of the package substrate 102).

In some embodiments, a plurality of solder balls 105 and a solder pattern 110 (also referred to as a pattern) may be disposed on the top surface 102a of the package substrate 102. In some embodiments, the package substrate 102 may include, but is not limited to, a substrate, a PCB, and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics, where each dielectric layer can be a photosensitive dielectric layer. For some embodiments, holes may be drilled in the PCB 102. For one embodiment, the PCB 102 may also include one or more conductive layers that are used to form traces, vias, pads, planes, and/or the like.

In some embodiments, the plurality of solder balls 105 may be disposed on the top surface 102a (or any other surface) of the package substrate 102 to couple one or more electrical components onto the packages substrate 102. In some embodiments, the plurality of solder balls 105 may be implemented as critical to function (CTF) solder balls. For example, these solder balls 105 may be disposed and positioned on the central region(s) of the package substrate 102—as opposed to the edges and/or the corner portions 102b of the package substrate 102.

Figure 2A:
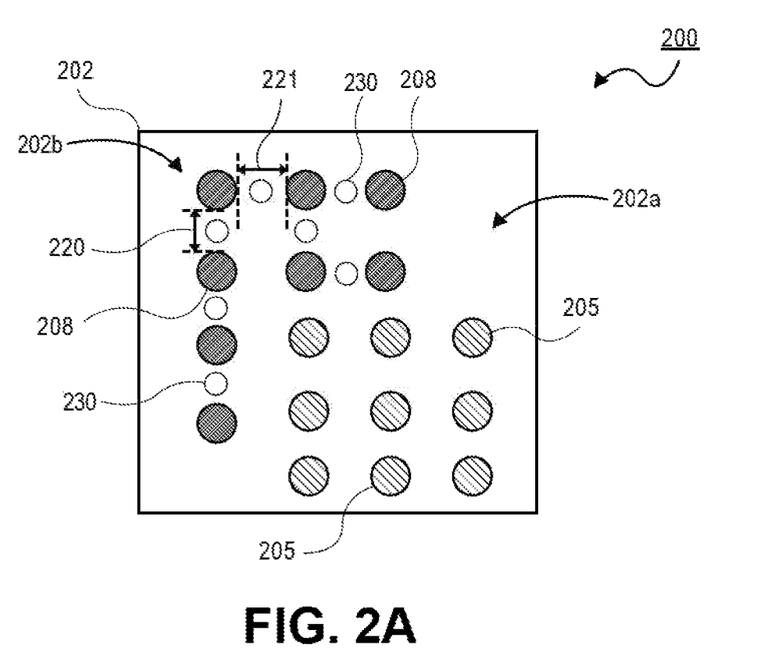
FIG. 2A is an illustration of a plan view of a process flow to form a semiconductor package having a plurality of first solder balls, a plurality of second solder balls, and a package substrate, according to one embodiment.
Figure 2B:
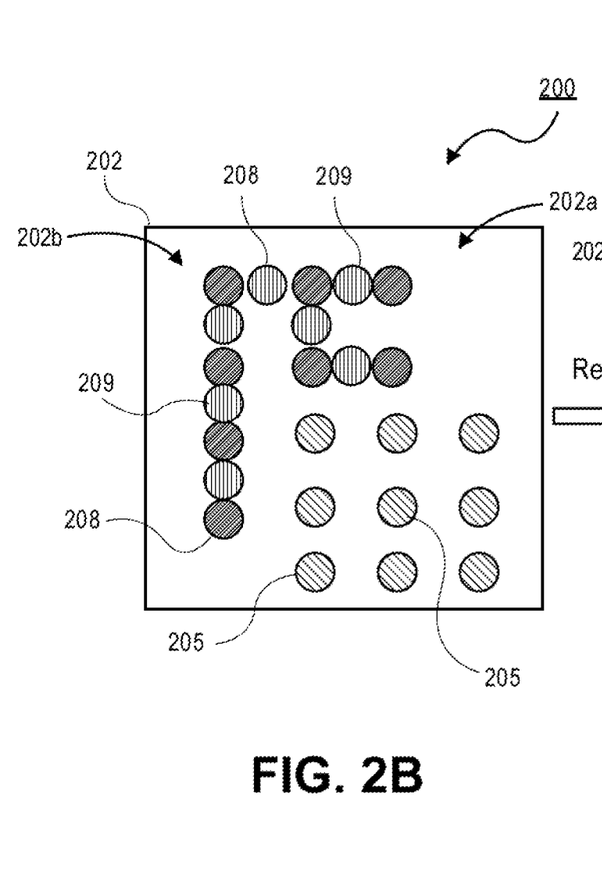
FIG. 2B is an illustration of a plan view of a process flow to form a semiconductor package having a plurality of first solder balls, a plurality of second solder balls, a plurality of third solder balls, and a package substrate, according to one embodiment.
Figure 2C:
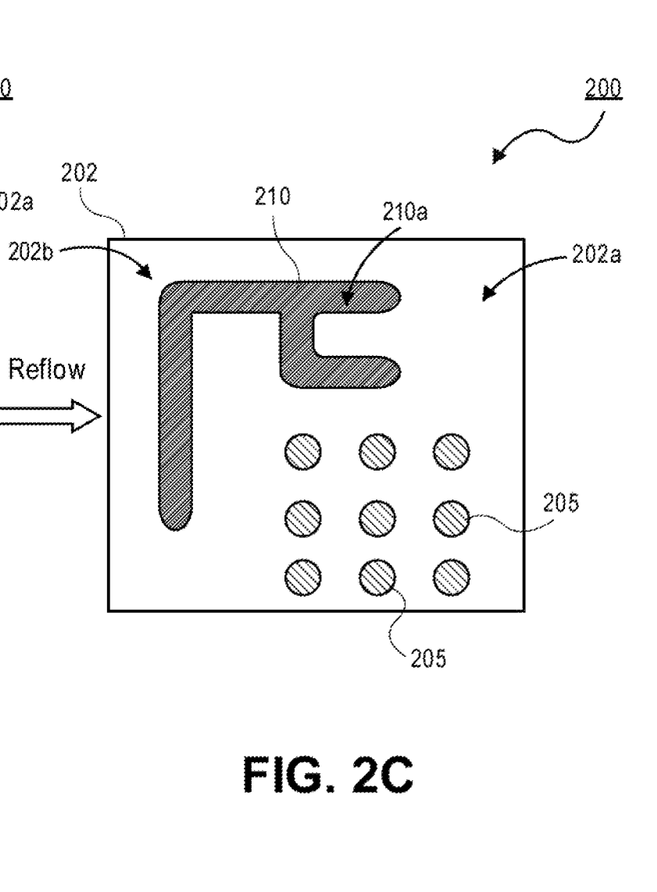
FIG. 2C is an illustration of a plan view of a process flow to form a semiconductor package having a package substrate that couples a plurality of second solder balls and a plurality of third solder balls after a reflow process, according to one embodiment.

Accordingly, as shown in FIG. 1, the semiconductor package 100 includes a package substrate 102 with one or more solder pattern(s) 110. In particular, for some embodiments, the package substrate 102 may have the top surface 102a with the corner portion 102b; the plurality of solder balls 105 on the top surface 102a of the package substrate 102; and the pattern 110 (or the solder pattern) on the corner portion 102b of the package substrate 102, where the pattern has a width that is substantially equal to a width of the plurality of solder balls 105, and where the pattern 110 includes a continuous line having one or more solder materials (i.e., as shown in FIGS. 2A-2C, the continuous line may include (or comprise of) one or more solder balls that are coupled (or reflowed) therein).

In some embodiments, the solder pattern 110 may have any pattern and/or any shape based on the desired packaging application/design. For example, the solder pattern 110 may be disposed on the corner portion 102b as a continuous line pattern which includes one or more solder lines. In an alternate embodiment, the solder pattern 110 may be disposed on the corner portion 102b, or an edge of the top surface 102a of the package substrate 102, as a pattern which includes one or more solder lines that are not continuous. The solder pattern 110 may be implemented on the corner portion 102b of the top surface 102a of the package substrate 102 as an enhanced sacrificial solder joint pattern (i.e., this enhanced sacrificial solder joint pattern may be a joint connection/pattern comprising of corner NCTF solder balls). As illustrated in FIG. 1, the solder pattern 110 may have a pattern that conforms to one of the corner portions 102b of the package substrate 102. In some embodiments, the solder pattern 110 (or a first pattern) may include a plurality of first solder balls and second solder balls that are coupled therein. That is, the solder pattern 110 may have the first solder balls disposed on the package substrate 102, the second solder balls subsequently disposed adjacently to the first solder balls on the package substrate 102, and a reflow process (or a similar heating process) couple the first and second solder balls to form the solder pattern 110 (e.g., as shown in FIGS. 2A-2C).

For some embodiments, the solder pattern 110 may include one or more different solder materials, such as a high temperature solder (e.g., SAC305), a low temperature solder (e.g., SnBiAg), a liquid sinterable solder paste (LPS), a solder thermal-interface material (sTIM), a polymer thermal-interface material (pTIM), epoxy cure, etc. For example, the solder pattern 110 may include one or more materials such as tin, silver, copper, bismuth, nickel, cobalt, manganeese, indium, alloy(s), and/or resins (or polymer resins). Additionally, the solder pattern 110 may be formed using one or more different soldering processes/tools, including a solder ball mount (SBM) process, a solder paste printing (SPP) process, and/or any similar known soldering processes.

The solder pattern 110 may have a top surface 110a that may be substantially coplanar, where the solder pattern 110 has a z-height defined by the top surface 102a of the package substrate 102 to the top surface 110a of the solder pattern 110. In one embodiment, the solder pattern 110 may have a z-height that is substantially equal all throughout. That is, the top surface 110a of the solder pattern 110 may be substantially flat and may be substantially parallel to the top surface 102a of the package substrate 102. Additionally, in some embodiments, the solder pattern 110 may have a width that is approximately 440 μm to 470 μm. For another embodiment, the solder pattern 110 may have a width that is approximately 440 μm or less based on the desired packaging design. For another embodiment, the solder pattern 110 may have a width that is approximately 440 μm or greater based on the desired packaging design. In addition, the solder pattern 110 may have a z-height that is substantially equal to a z-height of the plurality of solder balls 105.

For some embodiments, the solder pattern 110 may have a width that is substantially equal to a width (or a diameter) of the solder balls 105. This allows the semiconductor package 100 to implement a single SBM process/tool, thereby reducing the overall assembly time, improving cost-efficiency, simplifying material(s) inventory control, and mitigating bump height co-planarity issues (i.e., the solder ball height (or the bump height) of the solder ball 105 may be substantially equal to the bump height of the solder pattern 110). In addition, the solder pattern 110 has one or more outer edges that form the sidewalls of the solder pattern 110. These sidewalls of the solder pattern 110 may be substantially vertical sidewalls and/or tapered (or slanted) sidewalls.

Note that the package substrate 102 may have one solder pattern 110 positioned on each of the corner portions 102b of the package substrate 102, where each of the solder patterns 110 may be shown to have approximately the same size and dimensions as the solder pattern illustrated in FIG. 1; however one or more of the solder patterns 110 may have different sizes and dimensions based on the desired packaging design (i.e., in alternate embodiments, the solder pattern 110 may have a first pattern that is different from a second pattern of a second solder pattern that is disposed on the package substrate 102). As such, also note that for simplicity FIG. 1 only illustrates a top view of a corner portion 120b of the package substrate 102, but the package substrate 102 may include a plurality of solder patterns 110 (i.e., the semiconductor package 100 may have four solder patterns on each of the four corners of the package substrate 102, and/or may have more than four solder patterns disposed on the corners, edges, and/or any other desired surface of the package substrate 102).

Note that the semiconductor package 100 as shown in FIG. 1 may include fewer or additional packaging components based on the desired packaging design.

FIGS. 2A-2C are plan views of a process flow to form a semiconductor package 200 with a package substrate 202 having a plurality of first solder balls 208, a plurality of second solder balls 209, and a plurality of third solder balls 205, where the first and second solder balls 208-209 are coupled to form a solder pattern 210, according to one embodiment. The semiconductor package 200 of FIGS. 2A-2C may be substantially similar to the semiconductor package 100 of FIG. 1. As such, the components illustrated in FIGS. 2A-2C, such as the package substrate 202, the solder balls 205 and 208-209, and the solder pattern 210, may also be substantially similar to the components that are illustrated in the semiconductor package 100 of FIG. 1.

Referring now to FIG. 2A, a top-view illustration of a semiconductor package 200 with a package substrate 202 having a plurality of first solder balls 208 is shown, in accordance with an embodiment. In one embodiment, the semiconductor package 200 may include disposing the plurality of first solder balls 208 (or the first solder balls) and the third solder balls 205 on a top surface 202a of the package substrate 202. As shown in FIG. 2A, the first solder balls 208 may be disposed on and positioned along a corner portion 202b of the top surface 202a of the package substrate 202. The first solder balls 208 may be disposed adjacent to a plurality of conductive pads 230 (or a plurality of metals pads), where the conductive pads 230 are added on the corner portion(s) 202b of the package substrate 202 to accommodate the subsequently disposed solder balls (e.g., the second solder balls 209 as shown in FIG. 2B).

Note that, even if not shown, the first solder balls 208 are disposed, positioned over, and coupled to the conductive pads 230. For example, the conductive pads 230 may be disposed and positioned on the corner portion 202b of the top surface 202a of the package substrate 202 to align with the first solder balls 208 and the second solder balls (e.g., the second solder balls 209 as shown in FIG. 2B), where the conductive pads 230 are therefore arranged in a substantially similar pattern as the subsequently disposed solder pattern (e.g., the solder pattern 210 as shown in FIG. 2C). In some embodiments, the package substrate 202 may have a first width 220 and a second width 221, where both the widths 220-221 may be a width between two or more first solder balls 208. For some embodiments, the first and second widths 220-221 may have substantially the same widths; however, in other embodiments, the first width 220 may be different from the second width 221 (i.e., the first width 220 may have a width that may be greater/lesser than the second width 221).

Referring now to FIG. 2B, a top-view illustration of a semiconductor package 200 with the package substrate 202 having the first and second solder balls 208-209 is shown, in accordance with an embodiment. In one embodiment, the semiconductor package 200 may include disposing the second solder balls 209 on the top surface 202a of the package substrate 202. As shown in FIG. 2B, the second solder balls 209 may be disposed on and positioned along the corner portion 202b of the top surface 202a of the package substrate 202. In particular, the second solder balls 209 may be disposed over the conductive pads 230 that are shown in FIG. 2A. Accordingly, the second solder balls 209 may be disposed adjacent to the first solder balls 208 with substantially minimal space in between the first and second solder balls 208-209 (i.e. the first and second solder balls 208-209 may be positioned tightly next to each other as shown in FIG. 2B).

In one embodiment, the first solder balls 208 are formed of the same materials that are used to form the second solder balls 209. In another embodiment, the first and second solder balls 208-209 may be formed of different materials. For some embodiments, the first and second solder balls 208-209 may have substantially the same diameter (or the same size) as the diameter of the third solder balls 205. Note that FIGS. 2A-2B illustrate a two-step process to dispose the first and second solder balls 208-209 for illustrative purposes, however the first and second solder balls 208-209 may be disposed as a single-step process using a single SBM tool to subsequently form an enhanced sacrificial solder ball matrix (i.e., a solder pattern 210 as shown in FIG. 2C).

Referring now to FIG. 2C, a top-view illustration of a semiconductor package 200 with the solder pattern 210 on the package substrate 202 is shown, in accordance with an embodiment. In one embodiment, the semiconductor package 200 may include reflowing the first and second solder balls 208-209 (as shown in FIG. 2A) to dispose the solder pattern 210 on the top surface 202a of the package substrate 202. The solder pattern 210 may have any pattern and/or any shape based on the desired packaging application/design. As described above, for example, the solder pattern 210 may a continuous line pattern with one or more coupled solder lines. In an alternate embodiment, the solder pattern 210 may have a pattern disposed of one or more solder lines without having a continuous line pattern. The solder pattern 210 may be implemented on the top surface 202a of the package substrate 202 as an enhanced sacrificial solder joint pattern (or a NCTF solder joint pattern). That is, after the reflow process, the first and second solder balls 208-209 (as shown in FIG. 2B) couple together and form the solder pattern 210, where the solder pattern 210 may be defined as the enhanced sacrificial solder joint pattern used to improve the SJR of the package substrate 202.

As illustrated in FIG. 2C, the solder pattern 210 may have a pattern that conforms to one of the corner portions 202b of the package substrate 202. In some embodiments, the solder pattern 210 may include the first and second solder balls 208-209 (as shown in FIG. 2B) that are coupled therein. For some embodiments, as described above, the solder pattern 210 may include one or more different solder materials, such as a high temperature solder (e.g., SAC305), a low temperature solder (e.g., SnBiAg), a LPS paste, a sTIM, a pTIM, epoxy cure, etc. For example, the solder pattern 210 may include one or more materials such as tin, silver, copper, bismuth, nickel, cobalt, manganeese, indium, alloy(s), and/or resins (or polymer resins).

The solder pattern 210 may have a top surface 210a (or a bump height) that may be substantially coplanar, where the solder pattern 210 has a z-height defined by the top surface 202a of the package substrate 202 to the top surface 210a of the solder pattern 210. In one embodiment, the solder pattern 210 may have a z-height that is substantially equal all throughout. That is, the top surface 210a of the solder pattern 210 may be substantially flat and may be substantially parallel to the top surface 202a of the package substrate 202. Additionally, in some embodiments, the solder pattern 210 may have a width that is approximately 440 μm to 470 μm. For another embodiment, the solder pattern 210 may have a width that is approximately 440 μm or less based on the desired packaging design. For another embodiment, the solder pattern 210 may have a width that is approximately 440 μm or greater based on the desired packaging design. In addition, the solder pattern 210 may have a z-height that is substantially equal to a z-height of the plurality of solder balls 205.

For some embodiments, the solder pattern 210 may have a width that is substantially equal to a width (or a diameter) of the solder balls 205. This allows the semiconductor package 200 to implement a single SBM process/tool, thereby reducing the overall assembly time, improving cost-efficiency, simplifying material(s) inventory control, and mitigating bump height co-planarity issues (i.e., the solder ball height (or the bump height) of the solder ball 205 may be substantially equal to the bump height of the solder pattern 210). In addition, the solder pattern 210 has one or more outer edges that form the sidewalls of the solder pattern 210. These sidewalls of the solder pattern 210 may be substantially vertical sidewalls and/or tapered (or slanted) sidewalls.

Note that the package substrate 200 may have one solder pattern 210 positioned on each of the corner portions 202b of the package substrate 202, where each of the solder patterns 210 may be shown to have approximately the same size and dimensions as the solder pattern 210 illustrated in FIG. 2C; however one or more of the solder patterns 210 may have different sizes and dimensions based on the desired packaging design (i.e., in alternate embodiments, the solder pattern 210 may have a first pattern that is different from a second pattern of a second solder pattern that is disposed on the package substrate 202). Also note that for simplicity FIGS. 2A—2C only illustrates a top view of a corner portion 202b of the package substrate 202, but the package substrate 202 may include a plurality of solder patterns 210 (i.e., the semiconductor package 200 may have four solder patterns on each of the four corners of the package substrate 202, and/or may have more than four solder patterns disposed on the corners, edges, and/or any other desired surface of the package substrate 202).

Note that package substrate 200 as shown in FIGS. 2A-2C may include fewer or additional packaging components based on the desired packaging design.

FIG. 3 is an illustration of a cross-sectional view of a semiconductor packaged system 300 including a die 314, a substrate 312, a package substrate 302, and one or more solder patterns 350, according to one embodiment. FIG. 3 illustrates a semiconductor package 300 including a die 314, a substrate 312 (or an interposer), interconnect structures (e.g., the plurality of bumps disposed below the die 314 and the substrate 312, and the one or more solder patterns 350 disposed between the die 314, the substrate 312, and/or the package substrate 302), and the package substrate 302. In some embodiments, the semiconductor packaged system 300 may have one or more solder patterns 350 disposed on one or more corner portions on the bottoms surfaces of the substrate 312 and/or the die 314, where the solder patterns 350 may have a width that is substantially equal to a width of the other solder balls 316 and 318, and where the solder patterns 350 may be a continuous line having one or more solder materials, according to some embodiments For one embodiment, the semiconductor package 300 may implement the substrate 312 and/or the die 314 to include a solder pattern 350 (as the solder pattern 350 may be similar to the solder patterns described herein) disposed on the edges and/or corners of the respective substrate 312 and die 314, according to one embodiment. In one embodiment, the solder patterns 350 of the semiconductor packaged system 300 may be substantially similar to the solder patterns 110 and 210 of the semiconductor packages 100 and 200 of FIGS. 1-2. Note that the semiconductor package system 300 is not limited to the illustrated semiconductor packaged system, and thus may be designed/formed with fewer, alternate, or additional packaging components and/or with different interconnecting structures.

According to one embodiment, the semiconductor package 300 is merely one example of an embodiment of a semiconductor packaged system. For one embodiment, the semiconductor package 300 may include a BGA package, a land grid array (LGA) package, and/or a pin grid array (PGA) package. For one embodiment, a die 314 (or an IC die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on the package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320 and the solder patterns 350—may include one or more interconnect structures and underfill layers 326 and 328. In some embodiments, these interconnect structures (or connections) may variously comprise an alloy of nickel, palladium, and tin (and, in some embodiments, Cu). Additionally, the interconnect structures between the package substrate 302, the interposer 312, and the die 314 may include one or more solder patterns 350 as described herein.

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underfill material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor package 300 may include fewer or additional packaging components based on the desired packaging design.

Figure 4:
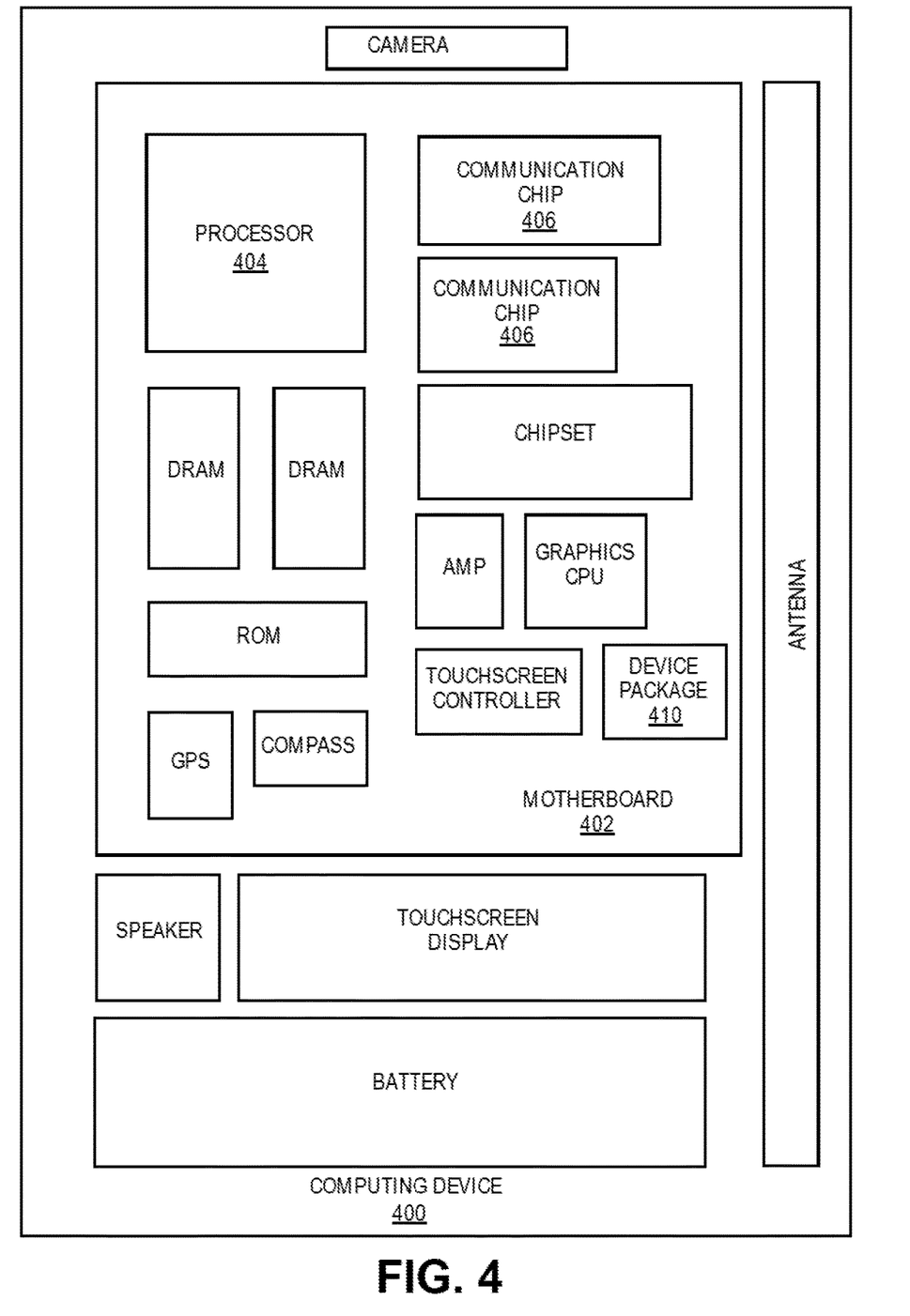
FIG. 4 is an illustration of a schematic block diagram illustrating a computer system that utilizes a semiconductor package with a plurality of solder balls and a plurality of solder patterns, according to one embodiment.

FIG. 4 is an illustration of a schematic block diagram illustrating a computer system 400 that utilizes a device package 410 (or a semiconductor package) with a plurality of solder balls and a plurality of solder patterns, according to some embodiments. FIG. 4 illustrates an example of computing device 400.

Computing device 400 houses motherboard 402. For one embodiment, motherboard 402 may be similar to the substrates 102, 202, and 302 of FIGS. 1-3. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be, but is not limited to, a substrate, a package substrate, and/or a PCB. Device package 410 may include a substrate (or a package substrate), a plurality of solder balls, and a plurality of solder patterns (e.g., as illustrated in FIGS. 1-3)—or any other components from the figures described herein. The device package 410 of the computing device 400 may include one or more solder patterns disposed on one or more surfaces of the package substrate, where these solder patterns may be substantially similar to the solder patterns 110 and 210 of FIGS. 1 and 2C.

Note that device package 410 may be a single component/device, a subset of components, and/or an entire system, as the materials, features, and components may be limited to device package 410 and/or any other component of the computing device 400 that may need one or more solder patterns (e.g., the motherboard 402, the processor 404, and/or any other component of the computing device 400 that may need the semiconductor packages (or components/structures) as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is system in package (SiP), comprising: a package substrate having a top surface, wherein the top surface has a corner portion; a plurality of solder balls on the top surface of the package substrate; and a pattern on the corner portion of the package substrate, wherein the pattern has a width that is substantially equal to a width of the plurality of solder balls, and wherein the pattern includes a continuous line having one or more solder materials.

In example 2, the subject matter of example 1 can optionally include a plurality of conductive pads on the package substrate.

In example 3, the subject matter of examples 1-2 can optionally include that the plurality of conductive pads are coupled to the pattern.

In example 4, the subject matter of examples 1-3 can optionally include that the pattern has a z-height that is substantially equal to a z-height of the plurality of solder balls.

In example 5, the subject matter of examples 1-4 can optionally include that the pattern includes a high temperature solder, a low temperature solder, a liquid sinterable solder paste (LPS), a solder thermal-interface material (sTIM), a polymer thermal-interface material (pTIM), or an epoxy cure.

In example 6, the subject matter of examples 1-5 can optionally include that the one or more solder materials include tin, silver, copper, bismuth, nickel, cobalt, manganeese, indium, alloys, or resins.

In example 7, the subject matter of examples 1-6 can optionally include that the pattern has a width of approximately 440 μm to 470 μm.

In example 8, the subject matter of examples 1-7 can optionally include that the pattern has one or more outer edges, and wherein the outer edges of the pattern are one or more sidewalls.

In example 9, the subject matter of examples 1-8 can optionally include that the sidewalls of the pattern are substantially vertical sidewalls or tapered sidewalls.

Example 10 is a method of forming a semiconductor package, comprising: disposing a plurality of solder balls on a top surface of a package substrate, wherein the top surface of the package substrate has a corner portion; disposing a plurality of first solder balls on the corner portion of the top surface of the package substrate; disposing a plurality of second solder balls on the corner portion of the top surface of the package substrate, wherein the plurality of second solder balls are disposed adjacent to the plurality of first solder balls; and reflowing the plurality of first and second solder balls to form a solder pattern, wherein the pattern has a width that is substantially equal to a width of the plurality of solder balls, wherein the pattern includes a continuous line, and wherein the continuous line includes one or more solder materials from the plurality of first and second solder balls.

In example 11, the subject matter of example 10 can optionally include disposing a plurality of conductive pads on the package substrate prior to disposing the pattern on the package substrate.

In example 12, the subject matter of examples 10-11 can optionally include that the plurality of conductive pads are coupled to the pattern.

In example 13, the subject matter of examples 10-12 can optionally include that the pattern has a z-height that is substantially equal to a z-height of the plurality of solder balls.

In example 14, the subject matter of examples 10-13 can optionally include that the pattern includes a high temperature solder, a low temperature solder, a LPS, a sTIM, a pTIM, or an epoxy cure.

In example 15, the subject matter of examples 10-14 can optionally include that the one or more solder materials include tin, silver, copper, bismuth, nickel, cobalt, manganeese, indium, alloys, or resins.

In example 16, the subject matter of examples 10-15 can optionally include the pattern has a width of approximately 440 μm to 470 μm.

In example 17, the subject matter of examples 10-16 can optionally include that the pattern has one or more outer edges, and wherein the outer edges of the pattern are one or more sidewalls.

In example 18, the subject matter of examples 10-17 can optionally include that the sidewalls of the pattern are substantially vertical sidewalls or tapered sidewalls.

Example 19 is a semiconductor packaging system, comprising: a substrate on a package substrate; a die on the substrate, wherein the substrate includes a top surface that has corner portions; a plurality of solder balls coupled to the substrate and the package substrate; and a plurality of patterns on the corner portions of the substrate, wherein the plurality of patterns couple the substrate to the package substrate, wherein the plurality of patterns have a width that is substantially equal to a width of the plurality of solder balls, and wherein the plurality of patterns include continuous lines having one or more solder materials.

In example 20, the subject matter of example 19 can optionally include that a plurality of conductive pads on the corner portions of the substrate; and a plurality of conductive pads on the package substrate, wherein the plurality of conductive pads of the package substrate align with the plurality of conductive pads of the substrate.

In example 21, the subject matter of examples 19-20 can optionally include that the plurality of patterns couple the plurality of conductive pads of the substrate to the plurality of conductive pads of the package substrate.

In example 22, the subject matter of examples 19-21 can optionally include that the plurality of patterns have a z-height that is substantially equal to a z-height of the plurality of solder balls.

In example 23, the subject matter of examples 19-22 can optionally include that the plurality of patterns include a high temperature solder, a low temperature solder, a LPS, a sTIM, a pTIM, or an epoxy cure, and wherein the one or more solder materials include tin, silver, copper, bismuth, nickel, cobalt, manganeese, indium, alloys, or resins.

In example 24, the subject matter of examples 19-23 can optionally include that wherein the plurality of patterns have a width of approximately 440 μm to 470 μm.

In example 25, the subject matter of examples 19-24 can optionally include that the plurality of patterns have one or more outer edges, wherein the outer edges of the plurality of patterns are one or more sidewalls, and wherein the sidewalls of the plurality of patterns are substantially vertical sidewalls or tapered sidewalls.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
    a package substrate having a top surface, wherein the top surface includes a corner portion;
    a plurality of solder balls on the top surface of the package substrate; and
    a pattern on the corner portion of the package substrate, wherein the pattern has a width that is substantially equal to a width of the plurality of solder balls, wherein the pattern includes a continuous line, wherein the continuous line includes one or more solder materials, and wherein a solder composition of the continuous line varies along the continuous line.

2. The semiconductor package of claim 1, further comprising a plurality of conductive pads on the package substrate.

3. The semiconductor package of claim 2, wherein the plurality of conductive pads are coupled to the pattern.

4. The semiconductor package of claim 1, wherein the pattern has a z-height that is substantially equal to a z-height of the plurality of solder balls.

5. The semiconductor package of claim 1, wherein the pattern includes a high temperature solder, a low temperature solder, a liquid sinterable solder paste (LPS), a solder thermal-interface material (sTIM), a polymer thermal-interface material (pTIM), or an epoxy cure.

6. The semiconductor package of claim 1, wherein the one or more solder materials include tin, silver, copper, bismuth, nickel, cobalt, manganeese, indium, alloys, or resins.

7. The semiconductor package of claim 1, wherein the pattern has a width of approximately 440 μm to 470 μm.

8. The semiconductor package of claim 1, wherein the pattern has one or more outer edges, and wherein the outer edges of the pattern are one or more sidewalls.

9. The semiconductor package of claim 8, wherein the sidewalls of the pattern are substantially vertical sidewalls or tapered sidewalls.

10. A method of forming a semiconductor package, comprising:
    disposing a plurality of solder balls on a top surface of a package substrate, wherein the top surface of the package substrate has a corner portion;
    disposing a plurality of first solder balls on the corner portion of the top surface of the package substrate;
    disposing a plurality of second solder balls on the corner portion of the top surface of the package substrate, wherein the plurality of second solder balls are disposed adjacent to the plurality of first solder balls; and reflowing the plurality of first and second solder balls to form a solder pattern, wherein the pattern has a width that is substantially equal to a width of the plurality of solder balls, wherein the pattern includes a continuous line, wherein the continuous line includes one or more solder materials from the plurality of first and second solder balls, and wherein a solder composition of the continuous line varies along the continuous line.

11. The method of claim 10, further comprising disposing a plurality of conductive pads on the top surface of the package substrate prior to disposing the plurality of first and second solder balls on the top surface of the package substrate.

12. The method of claim 11, wherein the plurality of conductive pads are coupled to the pattern.

13. The method of claim 10, wherein the pattern has a z-height that is substantially equal to a z-height of the plurality of solder balls.

14. The method of claim 10, wherein the pattern includes a high temperature solder, a low temperature solder, a LPS, a sTIM, a pTIM, or an epoxy cure.

15. The method of claim 10, wherein the one or more solder materials include tin, silver, copper, bismuth, nickel, cobalt, manganeese, indium, alloys, or resins.

16. The method of claim 10, wherein the pattern has a width of approximately 440 μm to 470 μm.

17. The method of claim 10, wherein the pattern has one or more outer edges, and wherein the outer edges of the pattern are one or more sidewalls.

18. The method of claim 17, wherein the sidewalls of the pattern are substantially vertical sidewalls or tapered sidewalls.

19. A semiconductor packaging system, comprising:
a substrate on a package substrate;
a die on the substrate, wherein the substrate includes a top surface that has corner portions; a plurality of solder balls coupled to the substrate and the package substrate; and
a plurality of patterns on the corner portions of the substrate, wherein the plurality of patterns couple the substrate to the package substrate, wherein the plurality of patterns have a width that is substantially equal to a width of the plurality of solder balls, wherein the plurality of patterns include continuous lines, wherein the continuous lines include one or more solder materials, and wherein a solder composition of the continuous line varies along the continuous line.

20. The semiconductor packaging system of claim 19, further comprising: a plurality of conductive pads on the corner portions of the substrate; and a plurality of conductive pads on the package substrate, wherein the plurality of conductive pads of the package substrate align with the plurality of conductive pads of the substrate.

21. The semiconductor packaging system of claim 20, wherein the plurality of patterns couple the plurality of conductive pads of the substrate to the plurality of conductive pads of the package substrate.

22. The semiconductor packaging system of claim 19, wherein the plurality of patterns have a z-height that is substantially equal to a z-height of the plurality of solder balls.

23. The semiconductor packaging system of claim 19, wherein the plurality of patterns include a high temperature solder, a low temperature solder, a LPS, a sTIM, a pTIM, or an epoxy cure, and wherein the one or more solder materials include tin, silver, copper, bismuth, nickel, cobalt, manganeese, indium, alloys, or resins.

24. The semiconductor packaging system of claim 19, wherein the plurality of patterns have a width of approximately 440 μm to 470 μm.

25. The semiconductor packaging system of claim 19, wherein the plurality of patterns have one or more outer edges, wherein the outer edges of the plurality of patterns are one or more sidewalls, and wherein the sidewalls of the plurality of patterns are substantially vertical sidewalls or tapered sidewalls.

* * * * *